United States Patent
Cavaleri et al.

(10) Patent No.: US 6,807,103 B2
(45) Date of Patent: Oct. 19, 2004

(54) PAGE-ERASABLE FLASH MEMORY

(75) Inventors: Paola Cavaleri, Rousset (FR); Bruno Leconte, Rousset (FR); Sébastien Zink, Aix en Provence (FR); Jean Devin, le Tholonet (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/438,733

(22) Filed: May 15, 2003

(65) Prior Publication Data

US 2004/0017722 A1 Jan. 29, 2004

Related U.S. Application Data

(63) Continuation of application No. PCT/FR01/03560, filed on Nov. 14, 2001.

(30) Foreign Application Priority Data

Nov. 15, 2000 (FR) .......................................... 00 14743

(51) Int. Cl.[7] .............................................. G11C 7/00
(52) U.S. Cl. ............................ 365/185.23; 365/185.02; 365/185.11
(58) Field of Search ...................... 365/185.23, 185.02, 365/185.11, 185.33, 230.03

(56) References Cited

U.S. PATENT DOCUMENTS

| | | | |
|---|---|---|---|
| 5,239,505 A | 8/1993 | Fazio et al. ................ 365/185 |
| 5,598,368 A | 1/1997 | Takahashi et al. ..... 365/185.01 |
| 5,994,732 A | 11/1999 | Ajika et al. ................. 257/315 |
| 5,995,417 A | * 11/1999 | Chen et al. ............ 365/185.29 |
| 6,021,083 A | 2/2000 | Shiau et al. ........... 365/230.01 |
| 6,620,682 B1 | * 9/2003 | Lee et al. .................... 438/257 |

OTHER PUBLICATIONS

IEEE Journal of Solid State Circuits, A 16–Mb Flash EEPROM with a New Self–Data–Refresh Scheme for a Sector Erase Operation, vol. 29, No. 4, Apr. 1994.

* cited by examiner

Primary Examiner—Vu A. Le
(74) Attorney, Agent, or Firm—Allen, Dyer, Doppelt, Milbrath & Gilchrist, P.A.; Lisa K. Jorgenson

(57) ABSTRACT

The present invention relates to a page-erasable FLASH memory including a memory array having a plurality of pages each with floating-gate transistors connected by their gates to word lines, a word line decoder connected to the word lines of the memory, and the application of a positive erase voltage to the source or drain electrodes of all the floating-gate transistors of a sector forming a page to be erased. According to the present invention, the word line decoder includes a unit for applying, when a page is being erased, a negative erase voltage to the gates of the transistors of the page to be erased, while applying a positive inhibit voltage to the gates of the transistors of at least one page that is not to be erased.

39 Claims, 6 Drawing Sheets

PAGE-ERASABLE FLASH MEMORY

RELATED APPLICATION

The present application is a continuation of International Application No. PCT/FR01/03560 filed on Nov. 14, 2001, the entire disclosure of which is incorporated herein by reference.

FIELD OF THE INVENTION

The present invention relates to electrically erasable and programmable memories, and more particularly to page-erasable FLASH memories.

BACKGROUND OF THE INVENTION

Currently, the market of electrically erasable and programmable memories in integrated circuits mainly comprises EEPROM memories and FLASH memories (or FLASH-EEPROM). EEPROM memories can be word programmable and erasable or page programmable and erasable. For technological reasons, FLASH memories (or FLASH-EEPROM) are generally word programmable and sector erasable, one sector generally comprising many pages.

As background, FIG. 1 schematically represents a FLASH memory array comprising a plurality of memory cells $CF_{i,j}$ arranged as a matrix and connected to word lines $WL_i$ and bit lines $BL_j$. The cells $CF_{i,j}$ of the FLASH memory are very simple in structure and only comprise one floating-gate transistor FGT, here an NMOS transistor, having its gate G connected to a word line $WL_i$, its drain D connected to a bit line $BL_j$ and its source S connected to a source line $SL_i$. The bit lines $BL_j$ are grouped together by columns of rank k to form binary words $W_{i,k}$ comprising for example eight cells $CF_{i,j}$ each (bytes), the cells of a single word $W_{i,k}$ possibly being adjacent (as represented in FIG. 1) or interlaced with cells belonging to other words. A physical page $P_i$ of the FLASH memory is formed by all the memory cells $C_{i,j}$ connected to a single word line $WL_i$, and thus comprises a plurality of binary words $W_{i,k}$. A sector is formed by a set of pages $P_i$ the source lines $SL_i$ of which are interconnected and are always at the same electric potential.

In such a FLASH memory, the programming of a cell involves injecting electric charges into the floating gate by hot electron injection effect while the erasing of a cell involves extracting electric charges trapped in the floating gate by tunnel effect. An erased transistor FGT has a positive threshold voltage VT1 of low value and a programmed transistor has a threshold voltage VT2 higher than VT1. When a read voltage $V_{READ}$ that is between VT1 and VT2 is applied to its gate, an erased transistor is on, which corresponds by convention to the reading of a logic "1", and a programmed transistor remains off, which corresponds by convention to the reading of a logic "0".

Due to the simplicity of their memory cells, which do not comprise access transistors as in EEPROM memories, FLASH memories have the advantage of being very compact in terms of silicon surface occupied and therefore have, for a constant silicon surface, a storage capacity that is much greater than that of EEPROM memories, for a lower cost price. However, they are less flexible to use due to the need to simultaneously erase all the memory cells of a single sector.

In certain applications, it is however desirable to benefit from the advantages of FLASH memories (compactness and cost price) while benefiting from the possibility of erasing by page, for example when the data to be logged are small in volume and the erasure of an entire sector before programming a page cannot be considered. However, finding a page-erasable FLASH memory involves certain difficulties.

To understand the problem posed, it will first be reminded that a memory cell can be erased according to the source erase method or the channel erase method. The source erase method, referring to FIG. 1, involves applying a positive erase voltage $V_{ER+}$ in the order of 4 to 5V to all the source lines $SL_i$ of a single sector, while the word lines $WL_i$ of the sector considered receive a negative erase voltage $V_{ER-}$ in the order of $-8V$, the material forming the channel of the transistors (substrate or well) being grounded. The effect of the difference in potential appearing between the source S and the gate G of the transistors is to force out the electric charges trapped in the floating gates (by tunnel effect) and to erase the transistors. The negative voltage $V_{ER-}$ is applied to the gates of all the transistors of a single sector by inhibiting a word line decoder XDEC (FIG. 1), which receives the voltage $V_{ER-}$ at one input and applies it to all the word lines $WL_i$ of the sector to be erased regardless of the address received at input. Simultaneously, all the outputs of a column decoder YDEC connected to the bit lines $BL_j$ are taken to high impedance.

The channel erase method can be distinguished from the source erase method by the fact that the positive erase voltage $V_{ER+}$ is applied to the sources of the transistors through the material forming the channel regions (substrate or well) to which a bias voltage $V_B$ is applied. The junctions PN existing between the channel regions and the source regions are biased in the forward direction and the voltage $V_B$ is passed onto all the sources of the transistors of a single sector to form the voltage $V_{ER+}$. At the same time, the negative erase voltage $V_{ER-}$ is, as above, applied to the gates of the transistors through the word line decoder XDEC that is in the inhibited state.

The advantage of a channel erase method is that the channel regions and the source regions are at substantially the same electric potential, the channel/source junction diodes being biased in the forward direction. Compared to a source erase method, there is therefore no longer any leakage current in the source/channel direction. The erase voltage $V_{ER+}$ can be taken to a higher potential than in the case of a source erase method, such as 8 to 10V for example against 4 to 5V in the first case.

One known approach for producing a page-erasable FLASH memory involves equipping each source line $SL_i$ with a select transistor allowing for a selective application of the erase voltage $V_{ER+}$. This approach is in accordance with the teaching disclosed by the patent EP 704 851 and the application WO 98/33187, in which the selective erasure of a word is obtained by equipping the cells of a single word with a source select transistor.

However, this approach has various disadvantages. Firstly, a FLASH memory cell is programmed with a considerable drain-source current. As a result, in the event of simultaneous programming of all the cells of a word, a high current is collected by the select transistor of the source line. This current leads to an increase in the drain-source voltage of the select transistor, a corresponding reduction in the drain-source voltage of the floating-gate transistors, and an increase in the programming time. The cells of a single word must therefore be programmed individually, or jointly with cells belonging to other binary words (WO 98/33187). Furthermore, providing source line select transistors is not compatible with the channel erase method. In fact, as the erase voltage $V_{ER+}$ is, in this case, applied through the material forming the channel, providing source line select transistors does not prevent the voltage $V_{ER+}$ from reaching the sources of transistors and from creating an electric field leading to charges trapped in the floating gates being forced out.

SUMMARY OF THE INVENTION

Therefore, an object of the present invention is to provide a method for selectively erasing one page of FLASH memory that does not require providing source line select transistors.

Another object of the present invention is to provide a method for selectively erasing one page of FLASH memory that is compatible with the channel erase method.

Another object of the present invention is to provide a page-programmable FLASH memory that is protected against a possible alteration of the threshold voltage of its floating-gate transistors, due in particular to the implementation of a selective page-erase method according to the present invention.

Therefore, the present invention provides a method for logging data in a FLASH memory comprising at least one sector, wherein the erasing of a page from the memory comprises applying a negative erase voltage to the gates of the floating-gate transistors of the page to be erased, applying a positive erase voltage to the source or drain electrodes of all the floating-gate transistors of the sector of the memory comprising the page to be erased, and applying a positive inhibit voltage to the gates of the transistors of at least one page of the memory that is not to be erased. The method comprises a step of controlling at least one page of the memory, comprising a first reading of the page by applying a first read voltage to the gates of the transistors of the page, a second reading of the page by applying a second read voltage to the gates of the transistors of the page, and reprogramming transistors if the two readings yield different results.

According to one embodiment, the second read voltage is higher than the first read voltage, the first read voltage corresponds to a normal read voltage used during phases of reading the memory, and the transistors are reprogrammed by using the data read by applying the first read voltage as reprogramming data.

According to one embodiment, the inhibit voltage is lower than the positive erase voltage.

According to one embodiment, the method comprises a step of providing voltage adapter circuits in the memory, each receiving a page select signal at input and delivering to the gates of the transistors of the corresponding page: a positive voltage, when the page select signal has a first value corresponding to the non-selection of the page and the memory is in erase mode or when the select signal has a second value corresponding to the selection of the page and the memory is not in erase mode, or a bias voltage lower than the positive voltage, when the select signal has the second value and the memory is in erase mode or when the select signal has the first value and the memory is not in erase mode.

According to one embodiment, the voltage adapter circuits receive: a bias voltage equal to the negative erase voltage and a positive voltage equal to the inhibit voltage during the erasing of a page, and a bias voltage equal to the ground potential and a positive voltage equal to a read voltage during the reading of a word in the memory.

According to one embodiment the method comprises, after each writing of a page in a sector of the memory, controlling K pages of the sector considered, K being strictly lower than the number of pages of the sector considered and at least equal to 1.

According to one embodiment, the control step is applied to at least one page of the memory located at an address read in a non-volatile counter formed by at least one row of floating-gate transistors.

According to one embodiment, the counter is incremented by one unit after the control of at least one page, by programming at least one floating-gate transistor of the counter without erasing the other transistors of the counter, the transistor programmed upon each new increment of the counter being the transistor following the transistor programmed upon the previous increment, according to a reading direction of the counter.

According to one embodiment, the counter comprises a plurality of words of increasing rank, and the reading in the counter of the address of at least one page to be controlled comprises the steps of reading the counter word by word until a word comprising a bit corresponding to an erased transistor is found, determining the most significant bits of the address of the page to be controlled using the rank, in the counter, of the first word found comprising a bit corresponding to an erased transistor, and determining the least significant bits of the address of the page to be controlled using the rank, in the first word found, of the first bit corresponding to an erased transistor.

According to one embodiment, the floating-gate transistors of the counter are arranged in a sector exclusively dedicated to the counter, such that programming voltages applied to floating-gate transistors of another sector of the memory are not passed onto the floating-gate transistors of the counter.

According to one embodiment, a page is controlled word by word and the control of a word comprises reading the word with the first read voltage, reading the word with the second read voltage, and reprogramming transistors if the two readings yield different results.

According to one embodiment, the positive erase voltage is applied to the source or drain electrodes of the floating-gate transistors through the material forming the channel of the transistors.

The present invention also relates to a page-erasable FLASH memory comprising a memory array comprising a plurality of pages each comprising floating-gate transistors connected by their gates to word lines, a word line decoder connected to the word lines of the memory, means for applying a positive erase voltage to the source or drain electrodes of all the floating-gate transistors of a sector comprising a page to be erased. The word line decoder comprises means for applying, when a page is being erased, a negative erase voltage to the gates of the transistors of the page to be erased, while applying a positive inhibit voltage to the gates of the transistors of at least one page that is not to be erased, the memory comprising means for controlling at least one page of the memory, arranged to carry out a first reading of the page by applying a first read voltage to the gates of the transistors of the page, carrying out a second reading of the page by applying a second read voltage to the gates of the transistors of the page, and reprogramming transistors of the page if the two readings yield different results.

According to one embodiment, the second read voltage is higher than the first read voltage, the first read voltage corresponds to a normal read voltage used during phases of reading the memory, and transistors are reprogrammed by using the data read by applying the first read voltage as reprogramming data.

According to one embodiment, the inhibit voltage delivered by the word line decoder is lower than the positive erase voltage.

According to one embodiment, the word line decoder comprises voltage adapter circuits receiving a page select signal at input and delivering to the gates of the transistors of the corresponding page: a positive voltage, when the select signal has a first value corresponding to the non-selection of the page and the memory is in erase mode or when the select signal has a second value corresponding to the selection of the page and the memory is not in erase mode, or a bias voltage lower than the positive voltage, when the select signal has the second value and the memory is in erase mode or when the select signal has the first value and the memory is not in erase mode.

According to one embodiment, the memory comprises means for supplying the voltage adapter circuits with: a bias voltage equal to the negative erase voltage and a positive voltage equal to the inhibit voltage during the erasing of a page, and a bias voltage equal to the ground potential and a positive voltage equal to a read voltage during the reading of a word in the memory.

According to one embodiment, the voltage adapter circuit comprises an output inverting stage receiving firstly the positive voltage and secondly the bias voltage, and a control stage of the inverting stage comprising an EXCLUSIVE OR logic function receiving the select signal and a signal having a determined value during the erasing of a page at input.

According to one embodiment, the control means are arranged for controlling, after each writing of a page in a sector of the memory, K pages of the sector considered, K being strictly lower than the number of pages of the sector considered and at least equal to 1.

According to one embodiment, the control means comprise a non-volatile counter formed by at least one row of floating-gate transistors, means for reading the address of at least one page to be controlled in the counter, and means for incrementing the counter after the control of at least one page.

According to one embodiment, the means for reading the address of at least one page to be controlled comprise means for reading the counter word by word and for searching for a word containing a bit corresponding to an erased transistor, means for delivering most significant bits of the address of the page to be controlled using the rank, in the counter, of the first word found containing a bit corresponding to an erased transistor, and means for calculating least significant bits of the address of the page to be controlled using the rank, in the first word found, of the first bit corresponding to an erased transistor.

According to one embodiment, the means for incrementing the counter are arranged to program at least one floating-gate transistor of the counter without erasing the other transistors of the counter, the transistor programmed upon each new increment being the transistor following the transistor programmed upon the previous increment, according to a reading direction of the counter.

According to one embodiment, the floating-gate transistors of the counter are arranged in a sector exclusively dedicated to the counter, such that programming voltages applied to floating-gate transistors of another sector of the memory are not passed onto the floating-gate transistors of the counter.

According to one embodiment, the means for controlling at least one page are arranged to control a page word by word, the control of a word comprising reading the word with the first read voltage, reading the word with the second read voltage, comparing the results of the two readings and reprogramming the transistors of the word if the two readings yield different results.

According to one embodiment, the positive erase voltage is applied to the source or drain electrodes of the floating-gate transistors through the material forming the channel of the transistors.

BRIEF DESCRIPTION OF THE DRAWINGS

These and other objects, features and advantages of the present invention shall be explained in greater detail in the following description of a page erase method and a memory cell control method according to the present invention, and of a FLASH memory implementing these two methods, given in relation with, but not limited to, the following figures.

DETAILED DESCRIPTION OF THE PREFERRED EMBODIMENTS

Selective Erasure of One Page of FLASH Memory

Figure 1:
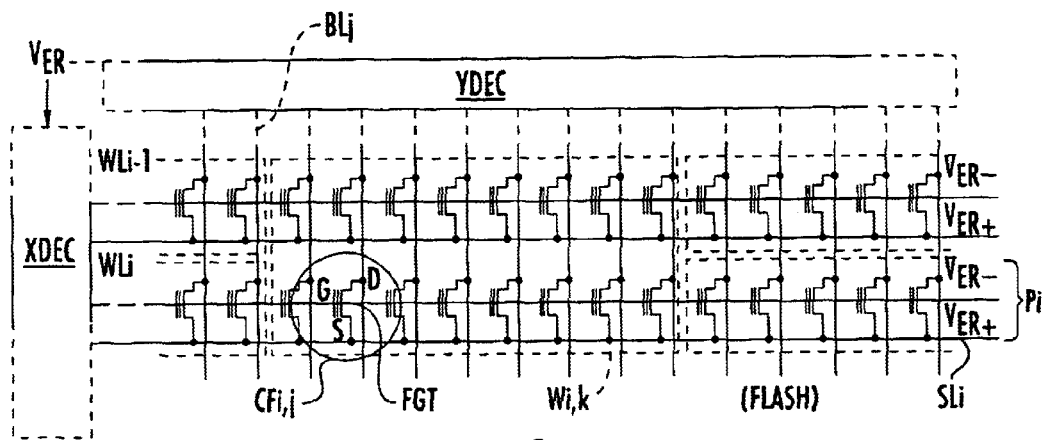
FIG. 1 is a schematic diagram of a conventional FLASH memory array.
Figure 2:
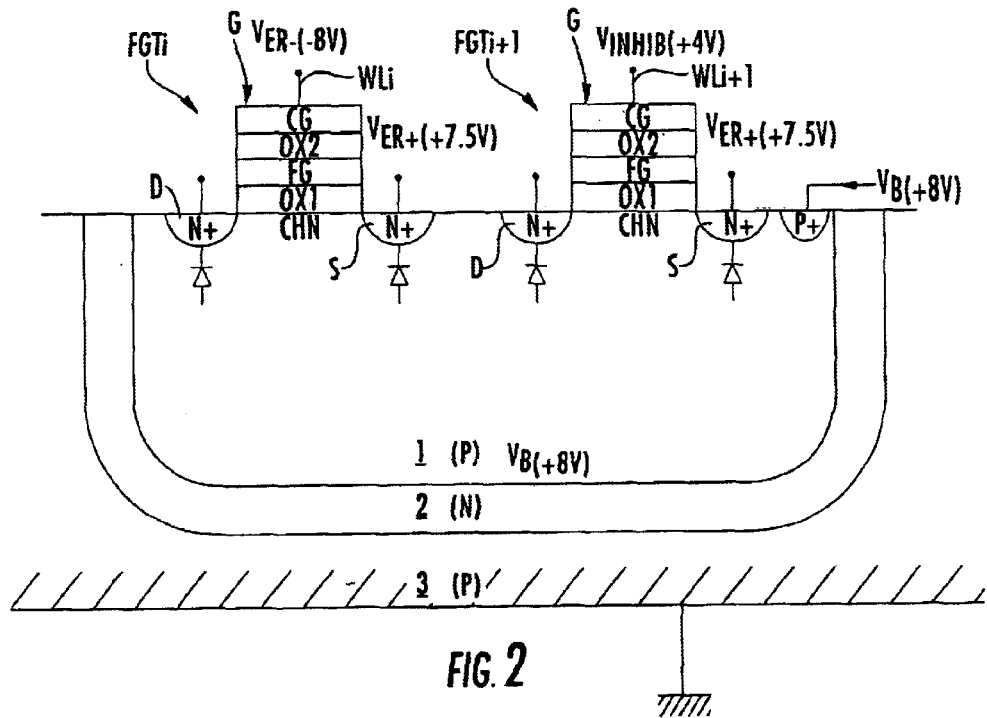
FIG. 2 is a schematic cross-section of two floating-gate transistors and illustrates the page erase method according to the present invention.

FIG. 2 is a cross-section of two floating-gate transistors $FGT_i$, $FGT_{i+1}$ of NMOS type, provided to be erased according to the channel erase method. Therefore, the transistors FGT are produced according to the so-called "triple-well" technique, which means that the material constituting the channel of the transistors is a well 1 of P type arranged in a well 2 of N type that is itself implanted in a substrate 3 of P type. The well 1 is therefore electrically insulated from the substrate 3 and can be taken to a voltage $V_B$ through a contact of P+ type while the substrate 3 is grounded.

The gate G of each transistor comprises a floating gate FG deposited on the well 1 through a fine layer of oxide OX1, and a control gate CG deposited on the floating gate FG through another layer of oxide OX2. The thicknesses of the layers are not represented to scale in order to keep the figure legible. The channel region CHN of each transistor extends under the gate oxide OX1 and is delimited by source and drain regions of N+ type implanted in the well 1.

When the transistors $FGT_i$, $FGT_{i+1}$ are erased, the well 1 is taken to a positive voltage $V_B$, such as 8 V for example, and an erase voltage $V_{ER+}$ in the order of 7.5 V appears at the sources S of the transistors, through the channel/drain junctions in the forward direction, as schematically represented by diodes. The voltage $V_{ER+}$ also appears at the drain regions, which are taken to high impedance by a column decoder (not represented).

In previous practices, the application of the voltage $V_{ER+}$ went hand in hand with the application of a negative erase voltage $V_{ER-}$ to all the gates of the transistors of a single sector, by inhibiting a word line decoder, which leads to simultaneously erasing all the transistors of the same sector, one sector comprising all the transistors the channel of which is formed in the same well 1. To obtain a page selective erasure, the idea of the present invention is to apply a positive inhibit voltage $V_{INHIB}$ to the gate of the transistors that are not to be erased which offsets all or part of the electric field created by the voltage $V_{ER+}$.

As an example, it will be assumed that the transistors $FGT_i$, $FGT_{i+1}$ have been programmed, that the transistor $FGT_i$, is connected to a word line $WL_i$ to be erased and that the transistor $FGT_{i-1}$ is connected to a word line $WL_{i+1}$ that is not to be erased. According to the present invention, the transistor $FGT_{i+1}$ receives the positive inhibit voltage $V_{INHIB}$ at its gate at the same time as the transistor $FGT_i$ receives the negative erase voltage $V_{ER-}$ at its gate. The voltage $V_{IHNIB}$ is between 0V and 8V and is preferably in the order of 4V to be able to be delivered by a decoder powered under 4 to 5V, as will be seen below. The voltage $V_{INHIB}$ offsets all or part of the electric field created by the voltage $V_{ER+}$ and counters the spurious erasing of the transistor $FGT_{i+1}$.

In practice, a voltage $V_{INHIB}$ in the order of 4V for an erase voltage $V_{ER+}$ in the order of 7.5V removes all electric stress on the transistor $FGT_{i+1}$, such that erase operations repeated on the transistor $FGT_i$ do not, long term, lead to the spurious erasing of the transistor $FGT_{i+1}$. A voltage $V_{INHIB}$ lower than 4V, for example in the order of 1 to 2V, may however, lead to a gradual erasing of the transistor $FGT_{i+1}$ and generally speaking of the other transistors of the sector receiving the erase voltage at their source. A method for controlling and refreshing the memory cells, allowing this disadvantage to be overcome, will be described below.

Figure 3A:
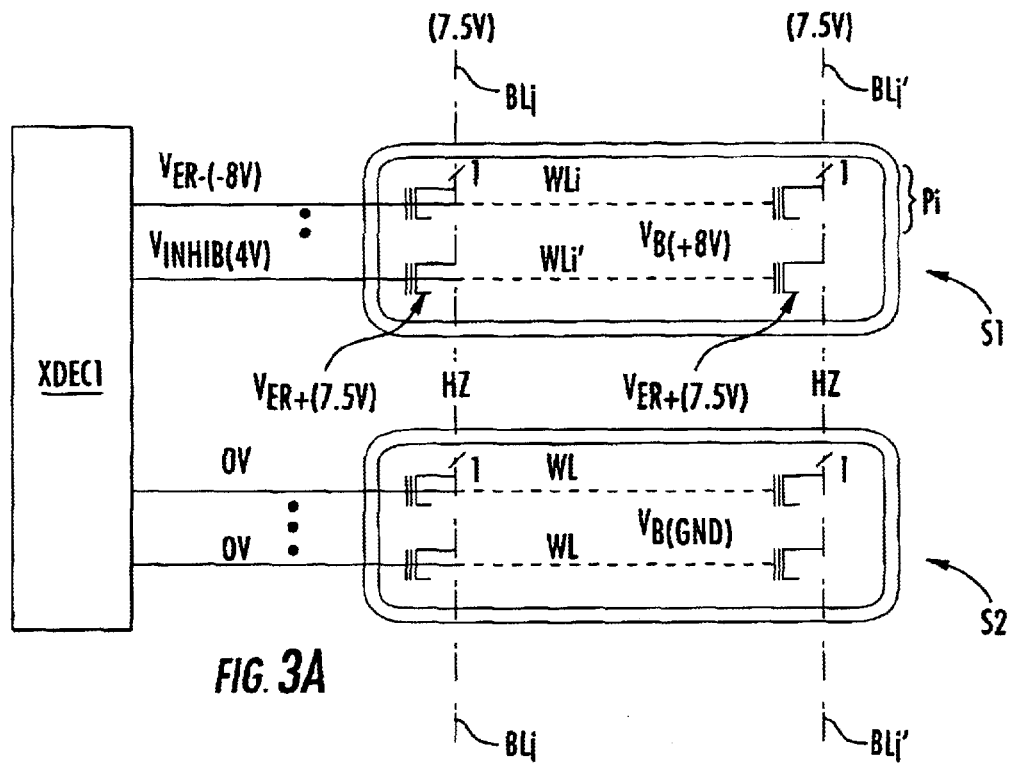
FIG. 3A schematically illustrates the implementation of the page erase method of the present invention in a FLASH memory.

FIG. 3A shows the implementation of the method of the present invention in a FLASH memory comprising two sectors S1, S2, each sector being formed by a P well implanted in an N well. The drains of the floating-gate transistors of each sector are connected to bit lines $BL_j$, $BL_j'$ controlled by a column decoder (not represented), and the gates of the floating-gate transistors are connected to word lines $WL_i$, $WL_i'$ controlled by a word line decoder XDEC1. The electric insulation of the bit lines of the same rank of each sector, such as the line $BL_j$ of the sector S1 and the line $BL_j$ of the sector S2 for example, is ensured by local decoding at the sectors which is classical in itself and is not represented on the Figure.

It will be assumed for example that the page $P_i$ of the sector S1 corresponding to the word line $WL_i$ must be erased without erasing the other pages of the sector S1 or those of the sector S2. The well of the sector S1 is taken to a voltage $V_B$ of several volts, such as 8V for example as described above, such that the positive erase voltage $V_{ER+}$ appears at all the sources of the transistors of the sector S1. According to the present invention, the decoder XDEC1 delivers the negative erase voltage $V_{ER-}$ to the word line to be erased $WL_i$ and delivers the inhibit voltage $V_{INHIB}$ to all the other word lines $WL_i'$ of the sector S1. Therefore, only the transistors of the page $P_i$ are erased and the electric stress suffered by the transistors of the other pages of the sector S1 is negligible, as already explained.

At the same time, in the sector S2, all the bit lines $BL_j$, $BL_j'$ are taken to high impedance (the insulation being obtained by a local decoding as indicated above), all the word lines WL receive a zero voltage (GND) and the well of the sector S2 is connected to the ground (GND). The transistors of the sector S2 are therefore entirely insulated from the erase voltages appearing in the sector S1.

It will be understood that the method of the present invention can be applied to simultaneously erasing several pages of a sector while preserving one or more other pages of the same sector from being erased. However, in the following description, it will be considered that an erase cycle comprises erasing one and only one page without erasing the other pages of the sector, which corresponds to the embodiment generally desired in practice.

Figure 3B:
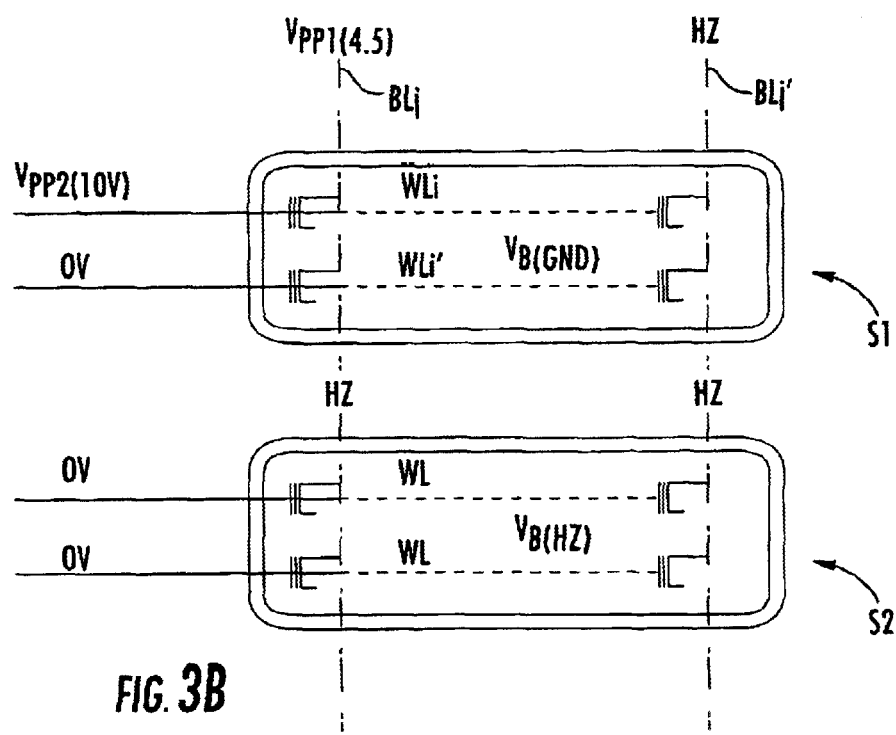
FIG. 3B schematically illustrates the programming of a word in a FLASH memory.

In a FLASH memory according to the present invention, the process of programming a word after erasing a page is carried out in accordance with previous practices, as shown in FIG. 3B. A word is programmed by applying a voltage $V_{PP1}$ from 4 to 6 V to the drain of the transistors to be programmed, through the corresponding bit lines $BL_j$, and by applying a programming voltage $V_{PP2}$ in the order of 10 to 12 V to the gate of the transistors, through the corresponding word line $WL_i$. The well corresponding to the sector considered is taken to the ground ($V_B$=GND). The transistors receiving the voltages $V_{PP1}$ and $V_{PP2}$ are on and highly biased during the operation. As the programming current is considerable, only a small number of transistors are programmed simultaneously, generally eight transistors i.e. one byte having all its bits on 0. The bit lines $BL_j'$ that do not correspond to the word to be programmed are taken to high impedance (HZ) and the word lines WL that do not correspond to the page where the word to be programmed is located are maintained at 0V (GND). In the neighboring sector S2, all the bit lines are taken to high impedance (HZ) and all the word lines are maintained at 0V.

Aspects of the Present Invention Concerning Word Line Decoders

The implementation of the method according to the present invention requires providing a word line decoder XDEC1 capable of selectively delivering the negative voltage $V_{ER-}$ to the word line $WL_i$ corresponding to the page $P_i$ to be erased, while applying the voltage $V_{INHIB}$ to the other word lines $WL_i'$ of the sector considered. However, classical word line decoders do not enable a selective application of the negative voltage $V_{ER-}$ to a word line designated by a determined address, the voltage $V_{ER-}$ being applied to all the word lines of the sector to be erased.

Reminders Concerning Conventional Negative Voltage Word Line Decoders

Figure 4:
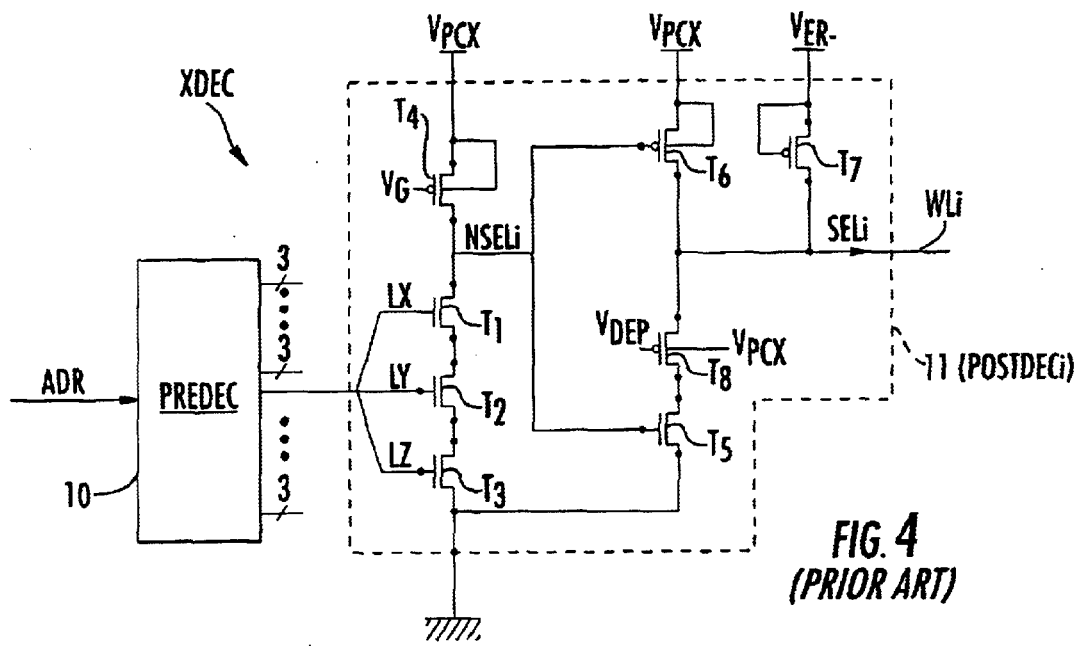
FIG. 4 schematically illustrates a conventional word line decoder.

FIG. 4 represents a conventional word line decoder XDEC, comprising a pre-decoder 10 (PREDEC) and a plurality of post-decoders 11 (POSTDEC$_i$), only one post-decoder 11 of rank i being represented. The pre-decoder 10 receives a select address ADR of a page at input and comprises a plurality of outputs, equal in number to the number of word lines to be controlled. To each of these outputs, the pre-decoder delivers select signals Lx, Ly, Lz that are applied to a post-decoder 11 of rank i. The post-decoder 11 delivers a select signal $SEL_i$ applied to the word line $WL_i$ of corresponding rank.

Each post-decoder 11 comprises at input a NAND gate comprising three NMOS transistors in series T1, T2, T3 forming the pull-down part of the NAND gate. The pull-up part of the NAND gate, which pulls the output node to a positive voltage $V_{PCX}$, is formed by a PMOS transistor T4 driven by a voltage VG. The gates of the transistors T1, T2 and T3 are respectively driven by the signals Lx, Ly, Lz. According to the value of these signals, the NAND gate delivers a signal $NSEL_i$ equal to 1 ($V_{PCX}$) or to 0 (GND). The signal $NSEL_i$ is applied to an inverting gate biased by the voltage $V_{PCX}$, comprising an NMOS transistor T5 and a PMOS transistor T6. The output node of the inverting gate delivers a select signal $SEL_i$ that may be equal to $V_{PCX}$ (logic "1") or to 0V (logic "0").

The voltage $V_{PCX}$ is equal to a voltage $V_{READ}$ in read mode and is equal to the programming voltage $V_{PP2}$ in programming mode. In erase mode, the negative voltage $V_{ER-}$ is delivered by a diode-arranged PMOS transistor T7, the drain of which receives the voltage $V_{ER-}$ and the source of which is connected to the output of the inverting gate T5/T6. To avoid a current leakage to the ground through the transistor T5, a PMOS insulation transistor T8, driven by a negative voltage $V_{DEP}$, is arranged between the output node of the inverting gate T5/T6 and the drain of the transistor T5.

When the negative erase voltage $V_{ER-}$ is applied to the post-decoder 11, the inverting gate T5/T6 is maintained in the high impedance state (transistor T4 on) and the post-decoder is inhibited. Therefore, all the post-decoders 11 of the decoder XDEC deliver the negative voltage $V_{ER-}$ which leads to erasing all the pages of a sector.

Example of a Word Line Decoder According to the Present Invention

Figure 5:
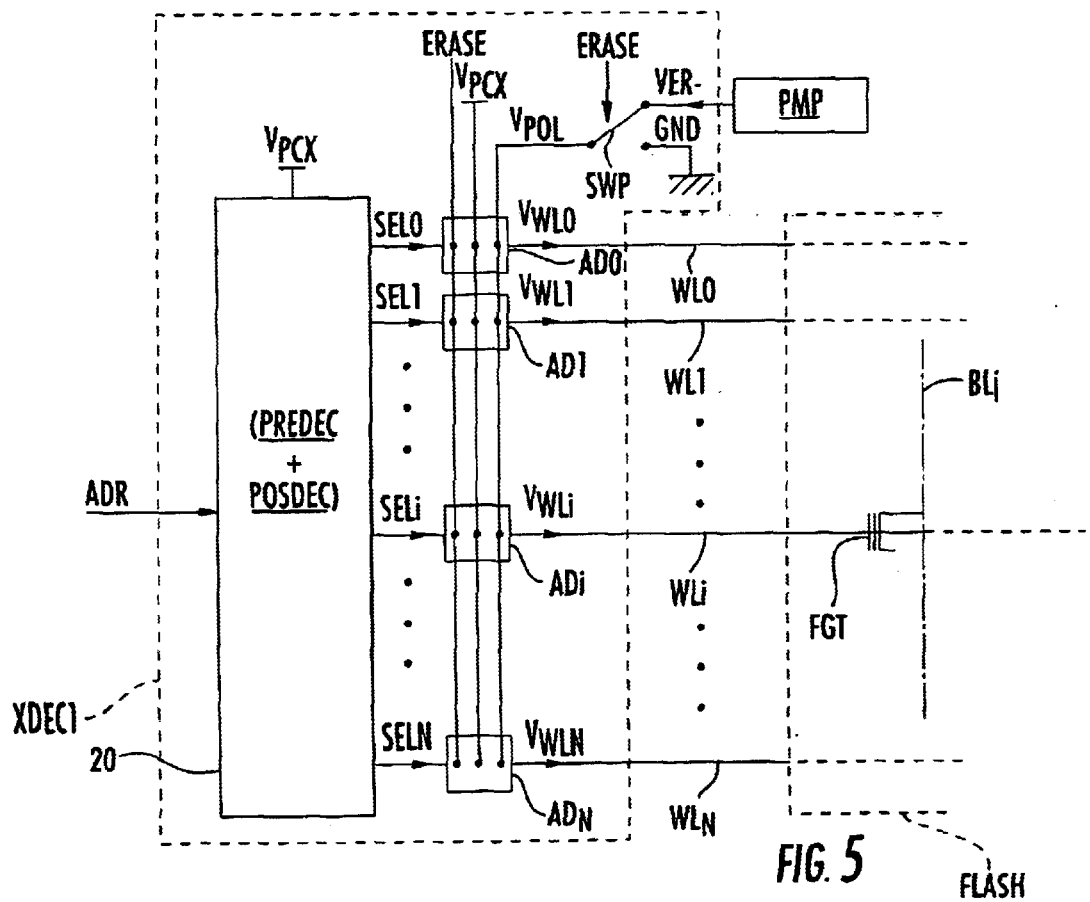
FIG. 5 schematically illustrates a word line decoder according to the present invention.

FIG. 5 represents a word line decoder XDEC1 according to the present invention, capable of selectively delivering a negative erase voltage $V_{ER-}$ to a word line $WL_i$ designated by an address ADR, while delivering an inhibit voltage $V_{INHIB}$ to the other word lines of a sector. It shall be noted that the decoder XDEC1 represented is provided to drive the word lines of a single sector. This decoder architecture must therefore be duplicated several times in a memory comprising several sectors, so as to inhibit the decoders XDEC1 associated with the sectors which are not concerned by a programming or an erasing operation occurring in another sector.

The decoder XDEC1 comprises a typical decoding stage 20 constituted by the pre-decoder PREDEC described above and by a plurality of post-decoders POSTDEC each delivering a page select signal $SEL_0$, $SEL_1$ ..... $SEL_i$, ... $SEL_N$ according to the address ADR received at input. The post-decoders are here of the positive voltage type, and correspond to the post-decoder 11 represented in FIG. 4 in which the transistors T7 and T8 are removed. As the decoding stage 20 is powered by the voltage $V_{PCX}$, the select signals delivered $SEL_i$ are therefore equal to $V_{PCX}$ or to 0V.

According to the present invention, the decoder XDEC1 comprises a plurality of voltage adapter circuits $AD_0$, $AD_1$, ... $AD_i$, ... $AD_N$ each receiving a select signal $SEL_0$, $SEL_1$, ... $SEL_i$, ... $SEL_N$ at input and delivering voltages $V_{WL0}$, $V_{WL1}$, ... $V_{WLi}$, ... $V_{WLN}$ to the word lines $WL_0$, $WL_1$, ... $WL_i$, ... $WL_N$ of the FLASH memory array that can be positive, negative or zero according to the operation being carried out and the value of the signal $SEL_i$ received at input. Each adapter circuit $AD_i$ receives a signal ERASE at another input, which is for example equal to 1 in page erase mode, and is supplied by the voltage $V_{PCX}$ and by a voltage $V_{POL}$.

The voltage $V_{PCX}$ is equal to the voltage $V_{READ}$ in read mode, to the programming voltage $V_{PP2}$ in programming mode and to the inhibit voltage $V_{INHIB}$ in erase mode. Furthermore, the voltage $V_{POL}$ is equal to the negative erase voltage $V_{ER-}$ in erase mode and is equal to 0V in the other operating modes of the memory. The voltage $V_{POL}$ is for example delivered by a switch SWP with two inputs driven by the signal ERASE, one input of the switch SWP receiving the voltage $V_{ER-}$ delivered by a charge pump PMP and the other input of the switch being connected to the ground. When the signal ERASE is on 1, the switch SWP delivers the voltage $V_{ER-}$. When the signal ERASE is on 0, the switch SWP connects the distribution line of the voltage $V_{POL}$ to the ground (GND).

The transfer function of each voltage adapter circuit $AD_i$ is described by table 1 below (the signals COM and NCOM are intermediary signals described below). It can be seen that in erase mode (ERASE=1) the voltage $V_{WLi}$ applied to a word line $WL_i$ is equal to $V_{ER-}$ if the word line is selected ($SEL_i$=1) or is equal to $V_{INHIB}$ if the word line is not selected ($SEL_i$=0). Outside erase periods (ERASE=0), the voltage $V_{WLi}$ applied to a selected word line $WL_i$ ($SEL_i$=1) is equal to the voltage $V_{PCX}$, which can be used as read voltage $V_{READ}$ or erase voltage $V_{PP2}$ according to the operation being carried out, while the voltage $V_{WLi}$ applied to a non-selected word line $WL_i$ ($SEL_i$=0) is zero.

TABLE 1

| ERASE | $SEL_i$ | COM | NCOM | $V_{WLi}$ |
|---|---|---|---|---|
| 0 | 0 | 0 | 1 | $V_{WLi} = V_{POL}$ = GND |
| 0 | 1 | 1 | 0 | $V_{WLi} = V_{PCX} = V_{READ}$ (4.5 V) or $V_{PP2}$ (8–10 V) |
| 1 | 0 | 1 | 0 | $V_{WLi} = V_{PCX} = V_{INHIB}$ (4 V) |
| 1 | 1 | 0 | 1 | $V_{WLi} = V_{POL} = V_{ER-}$ (−8 V) |

Figure 6:
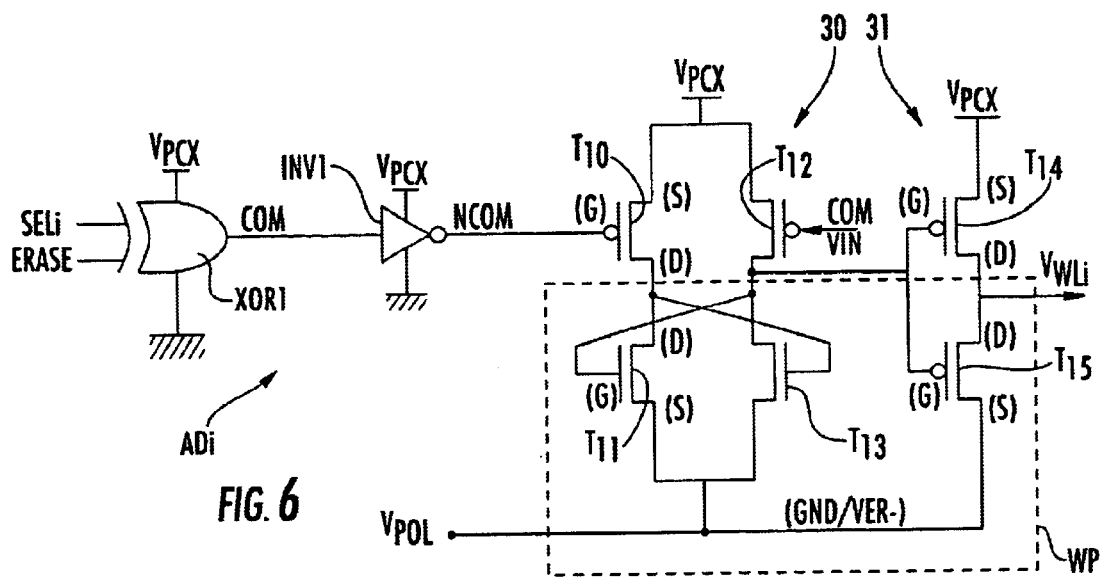
FIG. 6 is a schematic diagram of a voltage adapter circuit block in FIG. 5.

FIG. 6 represents one embodiment of a circuit $AD_i$ according to the present invention. The circuit $AD_i$ comprises a gate XOR1 of the EXCLUSIVE OR type receiving the signals $SEL_i$ and ERASE at input and delivering a signal COM. The signal COM is applied to an inverting gate INV1 delivering a signal NCOM. The gate XOR1 and the gate INV1 are supplied by the voltage $V_{PCX}$, such that the value of the signals COM and NCOM is the voltage $V_{PCX}$ when they are on "1". The signals COM and NCOM are applied to a driver stage 30 the output of which controls an inverting stage 31.

The driver stage 30 comprises two branches in parallel each comprising a PMOS transistor, respectively T10, T12, in series with an NMOS transistor, respectively T11, T13. The drains of the transistors T10, T12 receive the voltage $V_{PCX}$ while the sources of the transistors T11, T13 receive the voltage $V_{POL}$, which can be equal to the ground potential GND or to the negative voltage $V_{ER-}$ as already described above. The midpoint of the branch T12/T13 is connected to the gate of the transistor T11 and the midpoint of the branch T10/T11 is connected to the gate of the transistor T13.

The inverting stage 31 comprises a PMOS transistor T14 in series with an NMOS transistor T15, the transistor T14 receiving the voltage $V_{PCX}$ at its source and the transistor T15 receiving the voltage $V_{POL}$ at its source. The gates of the transistors are driven by the midpoint of the branch T12/T13, and the midpoint of the inverting stage T14/T15 delivers the voltage $V_{WLi}$. The NMOS transistors T11, T13 and T15 are produced in a P-type well WP insulated from the substrate by an N well, according to the triple-well technique described above.

The operation of the adapter circuit $AD_i$ is described by table 1 above. The driver stage 30, which receives the voltage $V_{POL}$ as pull-down voltage, allows a blocking voltage equal to $V_{ER-}$ to be applied to the gate of the transistor T15 of the inverting stage 31 when the drain of the transistor T15 receives the voltage $V_{ER-}$ ($V_{POL}$=$V_{ER-}$) or a blocking voltage equal to 0 V when the drain of the transistor T15 is grounded ($V_{POL}$=GND).

Controlling and Refreshing Memory Cells

As indicated above, providing an inhibit voltage of low value can lead to gradually erasing memory cells. However, in practice, and for technological reasons, it may be desired to implement the method of the present invention with an inhibit voltage of low value, in the order of 1 to 2V, rather than with a high inhibit voltage, in the order of 4V or more. To overcome this disadvantage, one approach of the present invention is to control, after each writing of a page, the floating-gate transistors of K pages of the memory, and to refresh the transistors having been controlled if necessary. "Writing a page" means a cycle of erasing the page (collective writing of "1") or a cycle of erasing/programming the page (collective writing of "1" then individual writing of "0" in all or part of the memory cells of the page).

The number K of pages controlled is advantageously lower than the total number of pages of the memory and is equal to 1 in a preferred embodiment of the method of the present invention. The K pages controlled after each writing must be different from the K pages controlled during a previous writing cycle, so as to gradually control all the pages of the memory.

Another approach of the present invention, that is optional but advantageous, is to manage the addresses of the pages to be controlled by means of a non-volatile counter incremented by one unit after each control of a page, the counter being produced by means of floating-gate transistors of the FLASH memory array. In this way, it is possible to cyclically check all the pages of the memory by returning to the first page of the memory by resetting the counter to zero, when the latter reaches the last memory address.

In a memory comprising several sectors, such a counter can be provided for each sector or for all the sectors. Providing such a counter poses the problem of the service life of the floating-gate transistors of the counter itself. In fact, if the counter is erased and reprogrammed with a new address value after each writing of a page, the number of cycles of erasing or programming the transistors of the counter will be very high, whether the counter is assigned to one sector or to the entire memory. To solve this problem, the present invention proposes a counter management mode involving programming a transistor of the counter upon each increment thereof, without erasing or reprogramming the other transistors of the counter save when the counter must be reset to zero. Therefore, the counting is done according to the token method, and one used token cannot be reused. The address of the page to be controlled is determined by the rank of the next token to be used, i.e. the rank of the first non-programmed transistor encountered according to the reading direction of the counter. When all the tokens are used, the counter is erased and the counting starts again from the first token.

Figure 8:
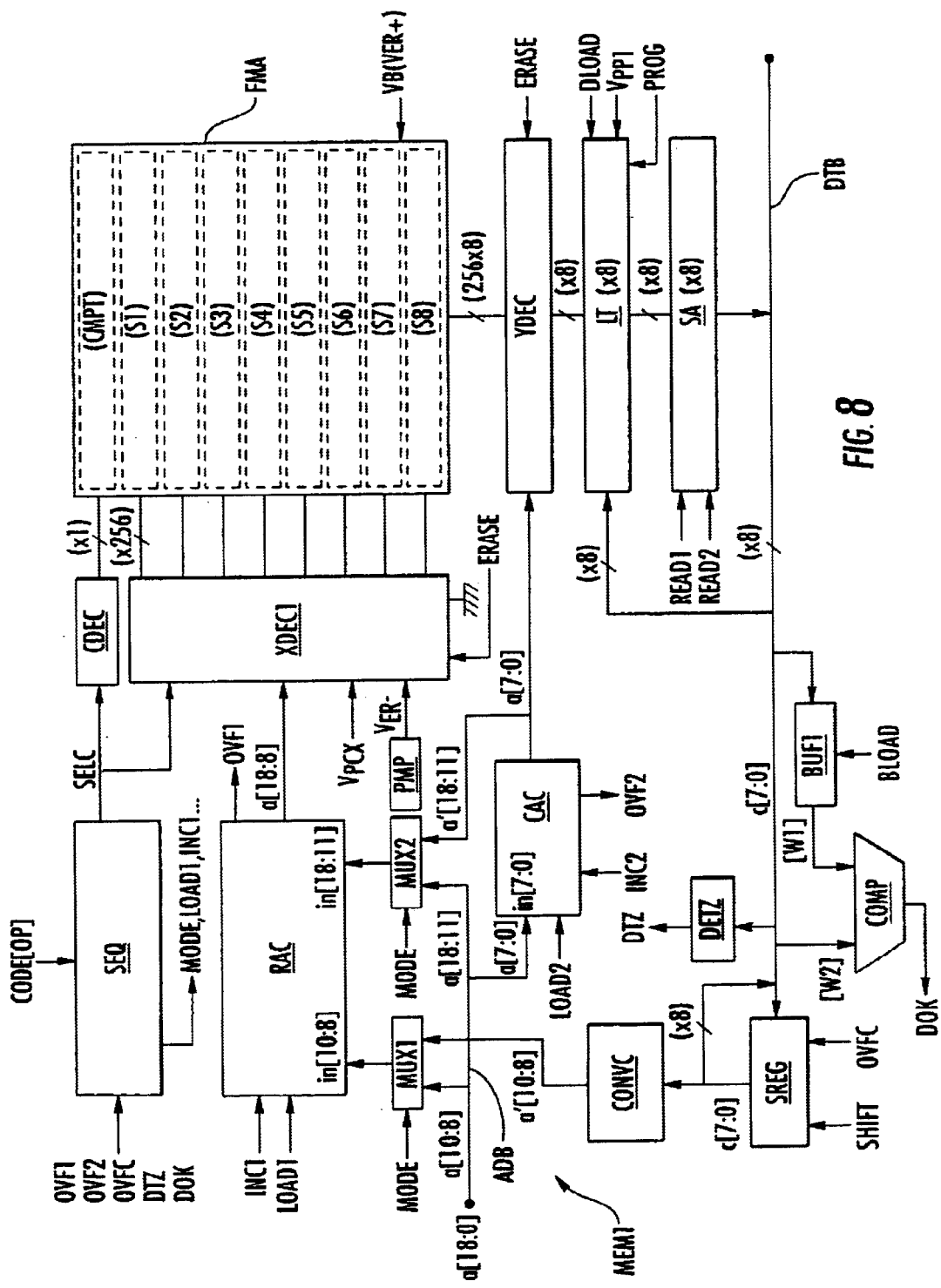
FIG. 8 is a schematic diagram of a FLASH memory according to the present invention, including means for implementing the erase method according to the present invention and a control and refresh method according to the present invention.

Example of an Embodiment of a Page-Erasable Memory Comprising Means for Controlling and Refreshing Memory Cells FIG. 8 represents in block form a memory MEM1 according to the present invention implementing the selective erase method according to the present invention and a method according to the present invention for controlling and refreshing memory cells. The memory MEM1 comprises a memory array FMA ("Flash Memory Array") here comprising eight memory sectors S1 to S8 and an extra sector forming a counter CMPT according to the present invention. Each of the sectors S1 to S8, insulated from the others by the triple-well technique, has 256 word lines $WL_i$ or pages each comprising 256 words of 8 bits (bytes), i.e. 2048 bit lines $BL_j$. The memory therefore has a total of 2048 pages distributed among the eight sectors and offers a storage capacity of 4 Mbits. Here the counter CMPT only comprises one word line and is dedicated to controlling the pages of the eight sectors S1 to S8. The counter CMPT contains 2048 bits, such that one bit of the counter can be assigned to designating a page according to the token method.

Moreover, the memory is fitted with a word line decoder XDEC1 according to the present invention, capable of applying the erase voltage $V_{ER-}$ or the inhibit voltage $V_{INHIB}$ to a word line $WL_i$. The addressing of the counter CMPT is carried out by a specific decoder CDEC activated by a signal SELC that automatically inhibits the decoder XDEC1. The memory MEM1 also comprises a column decoder YDEC, a programming register LT, a read circuit SA, a row address counter RAC and a column address counter CAC. The column decoder YDEC comprises 2048 inputs/outputs connected to the 2048 bit lines of the memory array FMA and eight inputs/outputs connected to the programming register LT and to the read circuit SA.

The register LT typically comprises eight high-voltage latches (not represented) enabling a byte to be programmed in the memory array, the latches being connected at output to the eight inputs/outputs of the column decoder YDEC and connected at input to a data bus DTB of eight bits. The register LT logs a byte present on the bus DTB upon receiving a signal DLOAD, and delivers the programming voltage $V_{pp1}$ to its outputs (according to the values of the bits of the byte loaded) upon receiving a programming signal PROG. The read circuit SA, activated by a signal READ, typically comprises eight sense amplifiers (not represented) connected to the eight inputs/outputs of the column decoder YDEC, and is connected at output to the data bus DTB.

The counter RAC ("Row Address Counter") receives at input eleven most significant address bits a[18:8] present on an address bus ADB, and delivers these address bits to the column decoder XDEC1. The counter RAC is driven by a signal LOAD1 for loading the address bits and can be incremented by a signal INC1. It delivers a signal OVF1 in the event of overflow after incrementation. The most significant address bits a [18:8] are applied to the counter RAC through two multiplexers MUX1, MUX2 each with two inputs. More particularly, the counter RAC receives three address bits a [10:8] at inputs in[10:8] through the multiplexer MUX1 one input of which is connected to the bus ADB, and receives eight address bits a[18:11] at inputs in [18:11] through the multiplexer MUX2 one input of which is also connected to the bus ADB. The multiplexers MUX1, MUX2 are driven by a signal MODE described below.

The counter CAC ("Column Address Counter") receives eight least significant address bits a[7:0] at inputs in [7:0] connected to the bus ADB. The output of the counter CAC delivers the address bits a[7:0] to the address input of the column decoder YDEC and is also connected to the second input of the multiplexer MUX2. The counter CAC is driven by a load signal LOAD2, by an increment signal INC2 and delivers an overflow signal OVF2 as necessary.

The memory MEM1 also comprises a shift register SREG with parallel input/output, a circuit CONV, a zero detector DETZ, a buffer BUF1, a logic comparator COMP and a sequencer SEQ. The register SREG has its input connected to the data bus DTB and its output is connected to the input of a conversion circuit CONVC and to the data bus DTB. The register SREG is driven by a shift signal SHIFT and delivers an overflow signal OVFC when its content reaches the value $00_H$ after a right shift. The circuit CONVC is a hard-wired logic circuit performing a decoding function described below. Its output is connected to the second input of the multiplexer MUX1.

The detector DETZ is connected at input to the data bus DTB, and delivers a signal DTZ on 1 when a byte equal to $00_H$ is present on the bus DTB. The buffer BUF1 has its input connected to the bus DTB and its output is applied to one input of the comparator COMP, the other input of which is connected to the bus DTB. The buffer BUF1 loads a datum upon receiving a load signal BLOAD, and the comparator COMP delivers a signal DOK ("Data OK") when a word W2 present on the data bus DTB is identical to a word W1 present at the output of the buffer BUF1. Finally, the hard-wired logic or microprocessor sequencer SEQ, such as a microcontroller for example, delivers all the control signals described above and receives all the signals sent by the elements described above.

The memory MEM1 operates normally during the operations of reading, writing or erasing, the operations to be performed being provided to the sequencer in the form of operation codes CODE[OP]. The signal MODE is on 1 and the multiplexers MUX1, MUX2 connect the address bus ADB to the inputs in[10:8] and in [18:11] of the counter RAC, the most significant address bits therefore being found again at input of the counter RAC and the least significant address bits at input of the counter CAC. In accordance with the present invention, an address page a[18:8] is erased by applying the voltage $V_{ER-}$ to the gates of the transistors of the page, while the transistors of the other pages of the sector aimed receive the inhibit voltage $V_{IHNIB}$ ($V_{PCX}$). At the same time, the voltage $V_B$ is applied to the well of the sector where the page to be erased is located, to generate the voltage $V_{ER+}$ on the source electrodes.

When a page has been erased, the sequencer SEQ triggers a read procedure of the counter CMPT aiming to determine the address of a page to be controlled. For that purpose, the sequencer activates the decoder CDEC via the signal SELC, sets the counter CAC to zero and activates the read circuit SA (signal READ). The first byte of the counter CMPT is delivered by the circuit SA to the data bus DTB. If the signal STZ at the output of the detection circuit DETZ is on 1, that means that the first byte read in the counter CMPT only comprises zeros. In other terms, that means that the floating-gate transistors in which the first byte of the counter CMPT is logged are all programmed. The sequencer therefore increments the counter CAC by one unit and reads the following byte, and so on and so forth as necessary until the signal DTZ goes to 0. When the signal DTZ goes to 0, the sequencer knows that a byte containing a bit on 1, corresponding to an erased transistor, has been found. It is the first non-zero byte of the counter CMPT.

The bits c[7:0] of the non-zero byte are loaded into the register SREG and are found again at the input of the conversion circuit CONVC. The latter delivers the least significant bits a'[10:8] of the address of the page to be controlled to the inputs in [10:8] of the counter RAC, through the multiplexer MUX1. The conversion of the bits c[7:0] of the non-zero byte into address bits a'[10:8] is performed by the circuit CONVC in accordance with the table described by table 2 below.

At the same time, the column address bits a [7:0] of the non-zero byte of the counter CMPT, applied by the counter CAC to the decoder YDEC, are present at the inputs in[10:8] of the counter RAC as most significant address bits a'[18:11] of the address of the page to be controlled. The address of the page to be controlled, comprising the bits a'[10:8] and the bits a ' [18:11], is therefore loaded into the counter RAC by means of the command LOAD1 and the page control process can begin.

TABLE 2 conversion table

| c[7:0] | a'[10:8] |
|---|---|
| 1 1 1 1 1 1 1 1 | 000 |
| 0 1 1 1 1 1 1 1 | 001 |
| 0 0 1 1 1 1 1 1 | 010 |
| 0 0 0 1 1 1 1 1 | 011 |
| 0 0 0 0 1 1 1 1 | 100 |
| 0 0 0 0 0 1 1 1 | 101 |
| 0 0 0 0 0 0 1 1 | 110 |
| 0 0 0 0 0 0 0 1 | 111 |

Figure 9:
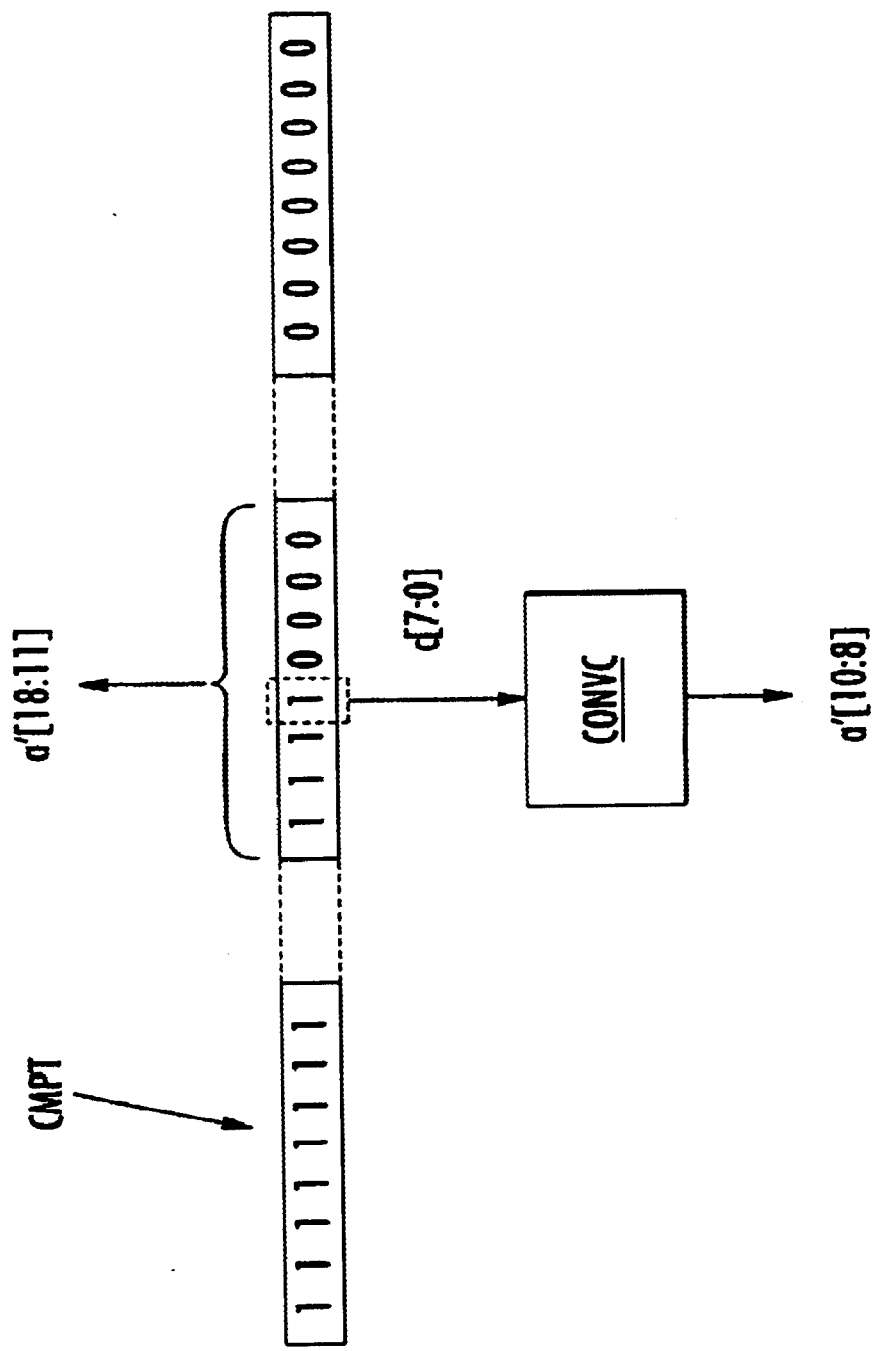
FIG. 9 is a diagram illustrating a method of reading a counter according to the present invention.

The method of reading the counter CMPT that has just been described is shown in FIG. 9. It can be seen that the most significant bits a'[18:11] of the address of the page correspond to the rank, in the counter CMPT, of the first non-zero byte found. It is therefore the address a[7:0] of the column containing the non-zero byte. Furthermore, the least significant bits a'[10:8] of the address of the page to be controlled correspond to the rank, in the first non-zero byte, of the first non-zero bit of the byte. Finally, the complete address a'[18:8] determined by this method corresponds to the rank in the counter CMPT of the first non-zero bit, i.e. to the rank of the first non-programmed transistor.

During the control step, the bytes of the page selected are read one after the other by incrementing the counter CAC. Advantageously, each byte is read via two different read voltages, the first being the conventional read voltage $V_{READ}$ and the second a verify voltage $V_{VRFY}$ higher than $V_{READ}$. The two voltages are obtained by varying the voltage $V_{PCX}$ applied to the decoder XDEC1.

Figure 7:
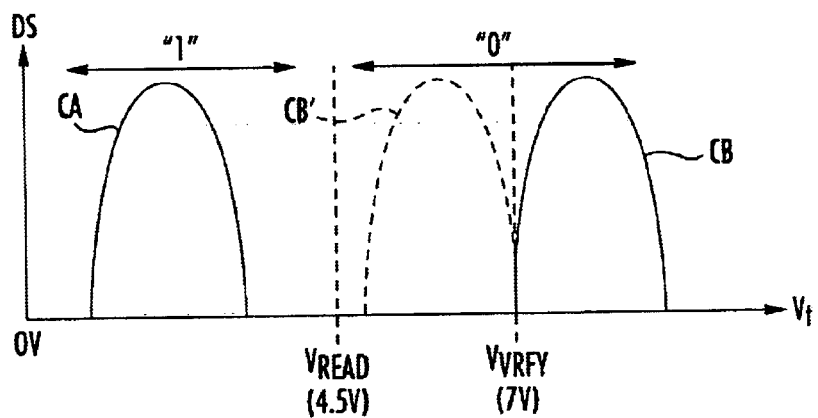
FIG. 7 is a graph representing statistical distribution curves of floating-gate transistor threshold voltages.

FIG. 7 shows the control and refresh method according to the present invention, and represents the statistical distribution DS of the threshold voltages Vt of erased transistors (curve CA, reading a "1") and the statistical distribution of the threshold voltages Vt of programmed transistors (curve CB, reading a "0"). Under the effect of electric stress, the curve CB tends to move slowly to the left, to form a curve CB'. The transistors that come within the curve CB' have lost electric charges and have lower threshold voltages than normal. The voltage $V_{READ}$, in the order of 4.5V, is located to the left of the curves CB and CB' and does not allow a transistor coming within the curve CB or a transistor coming within the curve CB' to be distinguished. The verify voltage $V_{VRFY}$, such as 7V for example, is however, located between the two curves CB, CB' and allows a transistor correctly programmed to be distinguished from a transistor the floating gate of which has lost electric charges, as in the first case the transistor will remain off and in the second case the transistor will be on. The comparison of a byte read via the two voltages $V_{READ}$, $V_{VRFY}$ thus enables the existence of at least one programmed transistor the threshold voltage of which has become lower than the voltage $V_{VRFY}$ to be detected.

The comparison is done simultaneously on the eight bits of each byte via the comparator COMP. The byte W1 read via the voltage $V_{VRFY}$ is stored in the buffer BUF1, and the byte W2 read with the voltage $V_{READ}$ is found again on the bus DTB and on the second input of the comparator. If the signal DOK at the output of the comparator goes to 0, the sequencer knows that all or part of the programmed transistors (if any) in which the byte is logged have lost electric charges. In this case, the byte W2, which is the reference byte as it has been read with the voltage $V_{READ}$, is loaded into the programming register LT and the sequencer triggers a programming cycle to refresh the damaged cells. During the programming cycle, the transistors reprogrammed are those that correspond to the reading of a bit on 0 with the voltage $V_{READ}$ and to the reading of a bit on 1 with the voltage $V_{VRFY}$, the erased transistors not being concerned by the operation.

When all the bytes of the page have been controlled and the damaged memory cells have been reprogrammed, the sequencer increments the counter CMPT by one unit. As indicated above, this increment involves programming the first non-programmed transistor found at the step of searching for the address of the page to be controlled. For that purpose, the sequencer applies the most significant address bits a[18:11] located at the output of the counter RAC to the counter CAC, as column address bits a [7:0] of the first non-zero byte of the counter CMPT. This operation is the opposite of the one done previously to find the address of the page to be controlled, and uses a connection between the output of the counter RAC and the input of the counter CAC, which has not been represented in FIG. 8 so as not to overload the diagram. Once the address of the non-zero byte is recovered by the counter CAC, the value of the non-zero byte, kept by the register SREG, is incremented by a right shift (signal SHIFT). The incremented value is then sent to the register LT to program the byte. As a single bit on 0 has been added by the right shift, the reprogramming of the non-zero byte will lead to the programming of the first erased floating-gate transistor found during the search for the address of the page to be controlled, the transistors already programmed not being reprogrammed.

If the register SREG delivers the overflow signal OVFC after inserting a bit on 0 by a right shift, that means that the byte only contains zeros. So, after programming the byte on 0 in the counter CMPT, the sequencer increments the counter CAC by way of verification. If the counter CAC delivers the overflow signal OVF2, that means that the byte on 0 was the last byte of the counter CMPT. In this case, the sequencer knows that it must reset the counter CMPT to zero after the next cycle of verifying a page, the page remaining to be verified being the last of the memory.

The method of controlling and refreshing transistors that has just been described is particularly easy to implement and only requires few material means. Further, it is substantially transparent to the user as the time for controlling and possibly reprogramming a page is in the order of 200 µs, to be compared with a time in the order of 1,275 µs (255×5 µs) to program the 255 bytes of a page, in addition to the time required to first erase the page.

It will be understood by those skilled in the art that different variations of embodiments of the present invention may be made.

For example, a counter CMPT according to the present invention may comprise several word lines, according to the size of the memory array to be controlled. For example, a memory of 016 sectors and of a capacity of 8 Mbits will require a counter of two lines of 2048 bits each, unless the counter is broken down into several counters dedicated to each of the sectors.

Secondly, although a method for counting lines to be refreshed has been proposed in which one "token" corresponds to one and only one transistor, it is also possible upon each increment of the counter to program a group of transistors representing a token, such as four transistors for example, to overcome a possible malfunction of a transistor. In this case, the method for finding the address of the line to be refreshed involves finding the first group of four bits comprising at least three bits equal to 1 in the counter.

The method according to the present invention may also be applied to memory cells comprising floating-gate transistors of the PMOS type, the voltage $V_{ER-}$ in this case being applied to the drains and not to the sources of the transistors.

That which is claimed is:

1. A method for operating a FLASH memory having a set of pages comprising floating-gate transistors and defining at least one sector, the method comprising:
   erasing a page by applying a negative erase voltage to gates of the floating-gate transistors of the page to be erased, applying a positive erase voltage to one of the source and drain of all the floating-gate transistors of the sector that includes the page to be erased, and applying a positive inhibit voltage to the gates of the floating-gate transistors of at least one page of the memory that is not to be erased; and
   controlling at least one page of the memory by performing a first reading of the page by applying a first read voltage to the gates of the floating-gate transistors of the page, performing a second reading of the page by applying a second read voltage to the gates of the floating-gate transistors of the page, and reprogramming the page if the first and second readings are different.

2. The method according to claim 1, wherein the second read voltage is higher than the first read voltage, the first read voltage corresponding to a normal read voltage used during reading of the memory; and wherein the floating-gate transistors are reprogrammed using data read during the first reading as reprogramming data.

3. The method according to claim 1, wherein the positive inhibit voltage is lower than the positive erase voltage.

4. The method according to claim 1, further comprising providing voltage adapter circuits in the memory, each receiving a page select signal at input and delivering to the gates of the floating-gate transistors of the corresponding page:
   a positive voltage when the page select signal has a first value corresponding to the non-selection of the page and the memory is in erase mode;
   the positive voltage when the select signal has a second value corresponding to the selection of the page and the memory is not in erase mode;
   a bias voltage lower than the positive voltage, when the select signal has the second value and the memory is in erase mode; and
   the bias voltage when the select signal has the first value and the memory is not in erase mode.

5. The method according to claim 4, wherein the voltage adapter circuits receive:
   the bias voltage equal to the negative erase voltage and the positive voltage equal to the inhibit voltage during erasing of a page; and
   the bias voltage equal to a reference potential and the positive voltage equal to a read voltage during reading of a word in the memory.

6. The method according to claim 1 further comprising, after each writing of a page in a sector of the memory, controlling at least one but not all pages of the sector.

7. The method according to claim 1, further comprising reading an address in a counter comprising at least one row of floating-gate transistors; wherein the control step is applied to at least one page of the memory located at the address.

8. The method according to claim 7, wherein the counter is incremented after the control of at least one page, by programming at least one floating-gate transistor of the counter without erasing the other floating-gate transistors of the counter, the floating-gate transistor programmed upon each increment of the counter being adjacent the floating-gate transistor programmed upon a previous increment, according to a reading direction of the counter.

9. The method according to claim 7, wherein the counter comprises a plurality of words of increasing rank, and the reading in the counter of the address of at least one page to be controlled comprises:

reading the counter word by word until a word comprising a bit corresponding to an erased floating-gate transistor is found;

determining the most significant bits of the address of the page to be controlled using the rank, in the counter, of the first word found comprising the bit corresponding to the erased floating-gate transistor; and determining the least significant bits of the address of the page to be controlled using the rank, in the first word found, of the first bit corresponding to the erased floating-gate transistor.

10. The method according to claim 7, wherein the floating-gate transistors of the counter are arranged in a sector exclusively dedicated to the counter, such that programming voltages applied to floating-gate transistors of other sectors of the memory are not passed onto the floating-gate transistors of the counter.

11. The method according to claim 1, wherein a page is controlled word by word and control of a word comprises reading the word with the first read voltage, reading the word with the second read voltage, and reprogramming floating-gate transistors if the first and second readings are different.

12. The method according to claim 1, wherein the positive erase voltage is applied to one of the source and drain electrodes of the floating-gate transistors through material forming the channel of the floating-gate transistors.

13. A method for operating a memory having a set of pages comprising transistors and defining at least one sector, the method comprising:

erasing a page by applying a first erase voltage to the transistors of the page to be erased, applying a second erase voltage to all the transistors of the sector that includes the page to be erased, and applying an inhibit voltage to the transistors of at least one page of the memory that is not to be erased; and controlling at least one page of the memory by performing a first reading of the page by applying a first read voltage to the floating-gate transistors of the page, performing a second reading of the page by applying a second read voltage to the transistors of the page, and reprogramming the page based upon a comparison of the first and second readings.

14. The method according to claim 13, wherein the second read voltage is higher than the first read voltage, the first read voltage corresponding to a normal read voltage used during reading of the memory; and wherein the transistors are reprogrammed using data read during the first reading.

15. The method according to claim 13, wherein the inhibit voltage is lower than the second erase voltage.

16. The method according to claim 13, further comprising providing voltage adapter circuits in the memory, each receiving a page select signal and delivering to the transistors of the corresponding page:

a positive voltage when the page select signal has a first value corresponding to the non-selection of the page and the memory is in erase mode;

the positive voltage when the select signal has a second value corresponding to the selection of the page and the memory is not in erase mode;

a bias voltage lower than the positive voltage, when the select signal has the second value and the memory is in erase mode; and the bias voltage when the select signal has the first value and the memory is not in erase mode.

17. The method according to claim 16, wherein the voltage adapter circuits receive:

the bias voltage equal to the first erase voltage and the positive voltage equal to the inhibit voltage during erasing of a page; and the bias voltage equal to a reference potential and the positive voltage equal to a read voltage during reading of a word in the memory.

18. The method according to claim 13 further comprising, after each writing of a page in a sector of the memory, controlling at least one but not all pages of the sector.

19. The method according to claim 13, further comprising reading an address in a counter comprising at least one row of transistors; wherein the control step is applied to at least one page of the memory located at the address.

20. The method according to claim 19, wherein the counter is incremented after the control of at least one page, by programming at least one floating-gate transistor of the counter without erasing the other floating-gate transistors of the counter.

21. A page-erasable FLASH memory comprising:

a memory array comprising a plurality of pages each comprising floating-gate transistors connected by their gates to word lines;

a word line decoder connected to the word lines of the memory;

means for applying a positive erase voltage to one of the source and drain of all the floating-gate transistors of a sector comprising a page to be erased;

the word line decoder comprising means for applying, when a page is being erased, a negative erase voltage to the gates of the transistors of the page to be erased, while applying a positive inhibit voltage to the gates of the transistors of at least one page that is not to be erased, and means for controlling at least one page of the memory, to carry out a first reading of the page by applying a first read voltage to the gates of the transistors of the page, to carry out a second reading of the page by applying a second read voltage to the gates of the transistors of the page, and to reprogram transistors of the page if the first and second readings are different.

22. A memory according to claim 21, wherein the second read voltage is higher than the first read voltage, the first read voltage corresponding to a normal read voltage used during phases of reading the memory, and transistors are reprogrammed using data read during the first reading.

23. A memory according to claim 21, wherein the inhibit voltage delivered by the word line decoder is lower than the second erase voltage.

24. A memory according to claim 21, wherein the word line decoder comprises voltage adapter circuits to receive a page select signal at input and deliver to the gates of the transistors of the corresponding page:

a positive voltage when the page select signal has a first value corresponding to the non-selection of the page and the memory is in erase mode;

the positive voltage when the select signal has a second value corresponding to the selection of the page and the memory is not in erase mode;

a bias voltage lower than the positive voltage, when the select signal has the second value and the memory is in erase mode; and the bias voltage when the select signal has the first value and the memory is not in erase mode.

25. A memory according to claim 24, comprising means for supplying the voltage adapter circuits with:

the bias voltage equal to the first erase voltage and the positive voltage equal to the inhibit voltage during erasing of a page; and the bias voltage equal to a reference potential and the positive voltage equal to a read voltage during reading of a word in the memory.

26. A memory according to claim 25, wherein the voltage adapter circuit comprises an output inverting stage to receive the positive voltage and the bias voltage, and a control stage for the output inverting stage comprising an EXCLUSIVE OR logic unit to receive the page select signal and a signal having a value determined during the erasing of a page.

27. A memory according to claim 21, wherein the control means controls, after each writing of a page in a sector of the memory, at least one but not all pages of the sector.

28. A memory according to claim 21, wherein the control means comprise:

a non-volatile counter comprising at least one row of floating-gate transistors;

means for reading an address of at least one page to be controlled from the counter; and means for incrementing the counter after the control of at least one page.

29. A memory according to claim 28, wherein the means for reading the address of at least one page to be controlled comprise:

means for reading the counter word by word and for searching for a word containing a bit corresponding to an erased transistor;

means for delivering most significant bits of the address of the page to be controlled using the rank, in the counter, of the first word found containing a bit corresponding to an erased transistor; and means for calculating least significant bits of the address of the page to be controlled using the rank, in the first word found, of the first bit corresponding to an erased transistor.

30. A memory according to claim 28, wherein the means for incrementing the counter program at least one floating-gate transistor of the counter without erasing the other transistors of the counter, the transistor programmed upon each new increment following a transistor programmed upon a previous increment, according to a reading direction of the counter.

31. A memory according to claim 28, wherein the floating-gate transistors of the counter are arranged in a sector exclusively dedicated to the counter, such that programming voltages applied to floating-gate transistors of another sector of the memory are not passed onto the floating-gate transistors of the counter.

32. A memory according to claim 21, wherein the means for controlling at least one page are arranged to control a page word by word, the control of a word comprising reading the word with the first read voltage, reading the word with the second read voltage, comparing results of the two readings and reprogramming the transistors of the word if the two readings yield different results.

33. A memory according to claim 21, wherein the second erase voltage is applied to one of the source and drain of the floating-gate transistor through material forming a channel of the transistor.

34. A page-erasable memory comprising:

a memory array comprising a plurality of pages each comprising transistors connected to word lines;

a word line decoder connected to the word lines of the memory;

a circuit to apply a second erase voltage to all the transistors of a sector comprising a page to be erased;

the word line decoder comprising a first unit to apply, when a page is being erased, a first erase voltage to the transistors of the page to be erased, while applying an inhibit voltage to the transistors of at least one page that is not to be erased, and a second unit to control at least one page of the memory, to carry out a first reading of the page by applying a first read voltage to the transistors of the page, to carry out a second reading of the page by applying a second read voltage to the transistors of the page, and to reprogram transistors of the page if the first and second readings are different.

35. A memory according to claim 34, wherein the second read voltage is higher than the first read voltage, and transistors are reprogrammed using data read during the first reading.

36. A memory according to claim 34, wherein the inhibit voltage delivered by the word line decoder is lower than the second erase voltage.

37. A memory according to claim 34, wherein the word line decoder comprises voltage adapter circuits to receive a page select signal at input and deliver to the gates of the transistors of the corresponding page:

a positive voltage when the page select signal has a first value corresponding to the non-selection of the page and the memory is in erase mode;

the positive voltage when the select signal has a second value corresponding to the selection of the page and the memory is not in erase mode;

a bias voltage lower than the positive voltage, when the select signal has the second value and the memory is in erase mode; and the bias voltage when the select signal has the first value and the memory is not in erase mode.

38. A memory according to claim 37, comprising a signal supply unit to supply the voltage adapter circuits with:

the bias voltage equal to the first erase voltage and the positive voltage equal to the inhibit voltage during erasing of a page; and the bias voltage equal to a reference potential and the positive voltage equal to a read voltage during reading of a word in the memory.

39. A memory according to claim 34, wherein the control means comprise:

a non-volatile counter comprising at least one row of floating-gate transistors;

an address reader to read an address of at least one page to be controlled from the counter; and an incrementer to increment the counter after the control of at least one page.

* * * * *

UNITED STATES PATENT AND TRADEMARK OFFICE
CERTIFICATE OF CORRECTION

PATENT NO. : 6,807,103 B2
DATED : October 19, 2004
INVENTOR(S) : Paola Cavaleri et al.

It is certified that error appears in the above-identified patent and that said Letters Patent is hereby corrected as shown below:

Column 7,
Line 23, delete "$FGT_{i-1}$" insert -- $FGT_{i+1}$ --

Column 15,
Line 58, delete "016" insert -- 16 --

Signed and Sealed this

Twenty-ninth Day of March, 2005

JON W. DUDAS
*Director of the United States Patent and Trademark Office*